United States Patent [19]

Delcourt

[11] Patent Number: 4,975,686
[45] Date of Patent: Dec. 4, 1990

[54] PROCESS AND APPARATUS FOR DETECTING PULSES DUE TO ELECTROSTATIC DISCHARGES FROM FURNITURE OR HUMAN BEINGS

[76] Inventor: Gilles Delcourt, 28, Côte de l'Hormet, 69110 Saint Foy Les Lyon, France

[21] Appl. No.: 435,675

[22] Filed: Nov. 14, 1989

[30] Foreign Application Priority Data

Nov. 14, 1988 [FR] France ................. 8815074

[51] Int. Cl.⁵ .............. G08B 21/00; G01R 29/12
[52] U.S. Cl. ................... 340/659; 340/522; 340/601; 324/457; 324/102; 324/72
[58] Field of Search .......... 340/659, 522, 601; 324/457, 458, 102, 72.5, 72; 361/111; 73/170 R

[56] References Cited

U.S. PATENT DOCUMENTS

| | | | |
|---|---|---|---|
| 3,611,365 | 10/1971 | Lundquist et al. | 340/601 |
| 3,629,852 | 12/1971 | Thexton et al. | 324/102 |
| 3,772,594 | 11/1973 | Kuhnast . | |
| 3,790,884 | 2/1974 | Kohl . | |
| 3,857,066 | 12/1974 | Cline et al. | 324/457 |
| 4,198,599 | 4/1980 | Krider et al. . | |
| 4,631,473 | 12/1986 | Honda | 324/72.5 |
| 4,825,152 | 4/1989 | Bossard | 324/457 |

FOREIGN PATENT DOCUMENTS 0058502 8/1982 European Pat. Off. .

Primary Examiner—Joseph A. Orsino
Assistant Examiner—Kinfe-Michael Negash
Attorney, Agent, or Firm—Bacon & Thomas

[57] ABSTRACT

The detection of brief pulses generating high frequencies is carried out by a system including: sensor for detecting an electrostatic field and for detecting an electromagnetic field, such that the variation of the electrostatic field ocurring in a period of time of less than 1 millisecond may be identified. A signal activator for warning about the presence, in an interval of time of less than 1 millisecond, of the variation of the electrostatic field detected and of the electromagnetic field, allowing identification of a pulse due to an electrostatic discharge from furniture or human beings. The invention is applicable to the detection of pulses due to electrostatic discharges.

8 Claims, 2 Drawing Sheets

PROCESS AND APPARATUS FOR DETECTING PULSES DUE TO ELECTROSTATIC DISCHARGES FROM FURNITURE OR HUMAN BEINGS

BACKGROUND OF THE INVENTION

1. Field of the Invention

The present invention relates to a process and apparatus for detecting pulses due to electrostatic discharges from furniture or human beings.

2. Description of the Related Art

The present invention concerns the technical domain of detecting brief pulses that generate high frequencies likely to appear, more particularly, in the environment of computer hardware in the general sense, i.e. any system comprising logic circuits for processing data.

Computer hardware is principally constituted by electronic components which, by nature, are very sensitive to mean and high frequencies. It follows that the hardware presents random dysfunctions in the presence of such frequencies. Now, practical experience shows that the premises or environment in which the computer hardware is installed, constitutes a place where high and mean frequencies frequently prevail.

It appears that the high frequencies are generated by brief pulses resulting, principally, from two phenomena. The first relates to the brief pulses of switching in the general sense, coming, for example, from the closure of relays or switches. The second concerns the brief pulses resulting from electrostatic discharges from furniture or human beings.

The state of the art discloses systems for detecting brief pulses, consisting in detecting, via an antenna, the electrical component or the magnetic component of the electromagnetic field generated by these brief pulses.

However, such known systems of the prior art do not distinguish the phenomenon having produced these brief pulses, which represents a considerable drawback, insofar as the technical solutions to be found for overcoming the effect of the brief pulses depend on the phenomenon having generated them.

The state of the art has also proposed, in U.S. Pat. No. 3,790,884, an apparatus for detecting the mean frequency pulses appearing during a storm. This apparatus detects, in a determined geographical location, with the aid of an antenna of 30 meters placed at 7 meters from the ground, the presence of severe storms presenting specific characteristics. This apparatus aims at detecting the maxima and minima of the variations of the electrostatic field developing in the given geographical location. Considering a curve representing the electrostatic field as a function of time, the minima and the maxima correspond to the portions of curve where the slope is zero. The apparatus also ensures detection of an electromagnetic field due, to atmospheric discharges with the aid of a band pass filter centred at a frequency of 455 kHz and with a width of 3 Hz. A severe storm is detected when, on the one hand, fifteen maxima or minima of the electro static field are detected in an interval of time of 1 minute and, on the other hand, when 2800 electromagnetic pulses due to atmospheric discharges appear per minute.

Such an apparatus detects storms in a given geographical location, but is not adapted to determine the phenomenon having produced pulses in a given premises containing computer hardware, due to the very principle of detection and the technical means employed.

The need is therefore felt to have available means for determining the origin of such brief pulses appearing the vicinity of computer hardware so as to employ technical solutions specifically adapted to the phenomena existing in the environment of the computer hardware.

SUMMARY OF THE INVENTION

It is therefore an object of the present invention to satisfy this need by proposing a process for detecting the brief pulses due to the electrostatic discharges from furniture or human beings, enabling the origin of the random dysfunctions of the hardware to be determined and employing technical solutions adapted to the origin of the dysfunction.

It is a further object of the invention to propose an apparatus for carrying out the process, of simple design and limited manufacturing cost.

To attain the objects set forth hereinabove, the process for detecting pulses, of the type in which an electromagnetic field and an electrostatic field are detected, is characterized by the following steps of:

detecting the electromagnetic field and the electrostatic field within a premises, detecting the electromagnetic field by a high pass filter of which the cut-off frequency is included between 15 MHz and 200 MHz, detecting the first variation of the electrostatic field occurring within a period of time less than 1 millisecond, and producing a warning signal when the variation of the electrostatic field detected and the presence of the electromagnetic field occur simultaneously in an interval of time less than 1 millisecond, making it possible to identify a pulse due to a so-called furniture or human electrostatic discharge.

BRIEF DESCRIPTION OF THE DRAWINGS

The invention will be more readily understood on reading the following description with reference to the accompanying drawings, in which.

DETAILED DESCRIPTION OF THE PREFERRED EMBODIMENTS

The process according to the invention aims at detecting brief pulses due to electrostatic discharges from furniture or human beings that are likely to occur in the environment of computer hardware in the general sense. The process according to the invention consists of proceeding locally, in the environment of the computer hardware, with the detection both of an electromagnetic field and of an electrostatic field. The process further consists of detecting the first variation of the electrostatic field previously detected and occurring in a determined interval of time. A warning signal is then generated upon the simultaneous presence of the electromagnetic field produced by a brief pulse due to an electrostatic discharge and of a variation of the electrostatic field detected. The appearance of such a warning signal makes it possible to identify a pulse due to a so-called furniture or human electrostatic discharge, which is determined by a rapid variation of the electrostatic field giving rise to the appearance of a pulse of which the electromagnetic field that it generates is simultaneously detected.

It must be considered that the process aims at detecting the variations of the electrostatic field occurring in a time less than or equal to 1 millisecond, so as to take into account only the variations of electrostatic field corresponding to electrostatic discharges and not to simple fluctuations of the field. Moreover, the electromagnetic field is detected with the aid of a high pass filter whose cut-off frequency is included between 15 MHz and 200 MHz. Furthermore, it must be noted that the warning signal is generated when the variation of the electrostatic field detected and an electromagnetic field appear at the same time, in an interval of time of less than 1 millisecond. This term simultaneous must therefore be understood as corresponding to an interval of time of less than 1 millisecond. Moreover, the process aims at detecting the first variation of the electrostatic field occurring in an interval of time of less than 1 millisecond, insofar as two successive electrostatic discharges may be spaced apart by several hours or several days. In this way, the process according to the invention takes into account every electrostatic discharge occurring in a given location.

Figure 1:
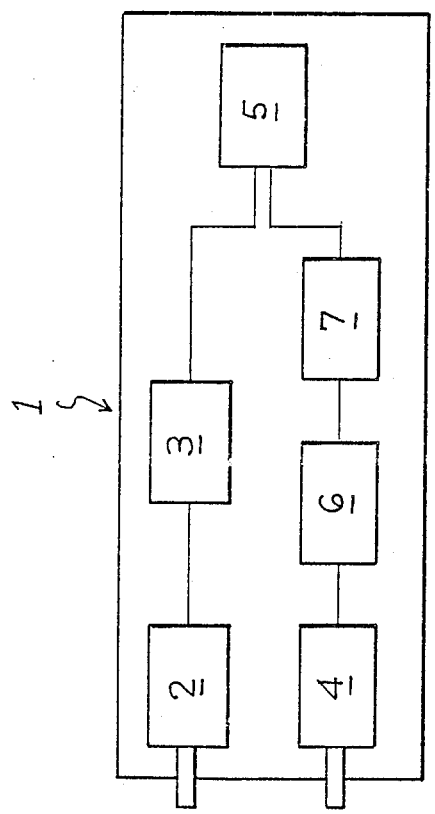
FIG. 1 is a functional block diagram of an apparatus for carrying out the process of detection according to the invention.

Referring now to the drawings, FIG. 1 illustrates a functional block diagram of a detection apparatus 1 according to the invention, comprising a sensor 2 for detecting an electrostatic field, connected to a means 3 for detecting the variation of the electrostatic field previously detected. The apparatus 1 also comprises a detector 4 for detecting an electromagnetic field, connected to a means 5 for warning about the simultaneous presence of the variation of the electrostatic field and of the electromagnetic field.

The detector 4 is preferably connected to the warning means 5 via a stage 6 for detecting the electromagnetic field beyond a determined threshold and a circuit 7 for holding the signal issuing from the detection stage 6, for an interval of time determined in relation to the response time of the detection means 3. The detection stage 6 makes it possible to adjust the sensitivity of the apparatus as desired, whilst the holding circuit 7 makes it possible to obtain virtually simultaneous activation of the warning means 5 corresponding to a pulse due to an electrostatic discharge.

Figure 2:
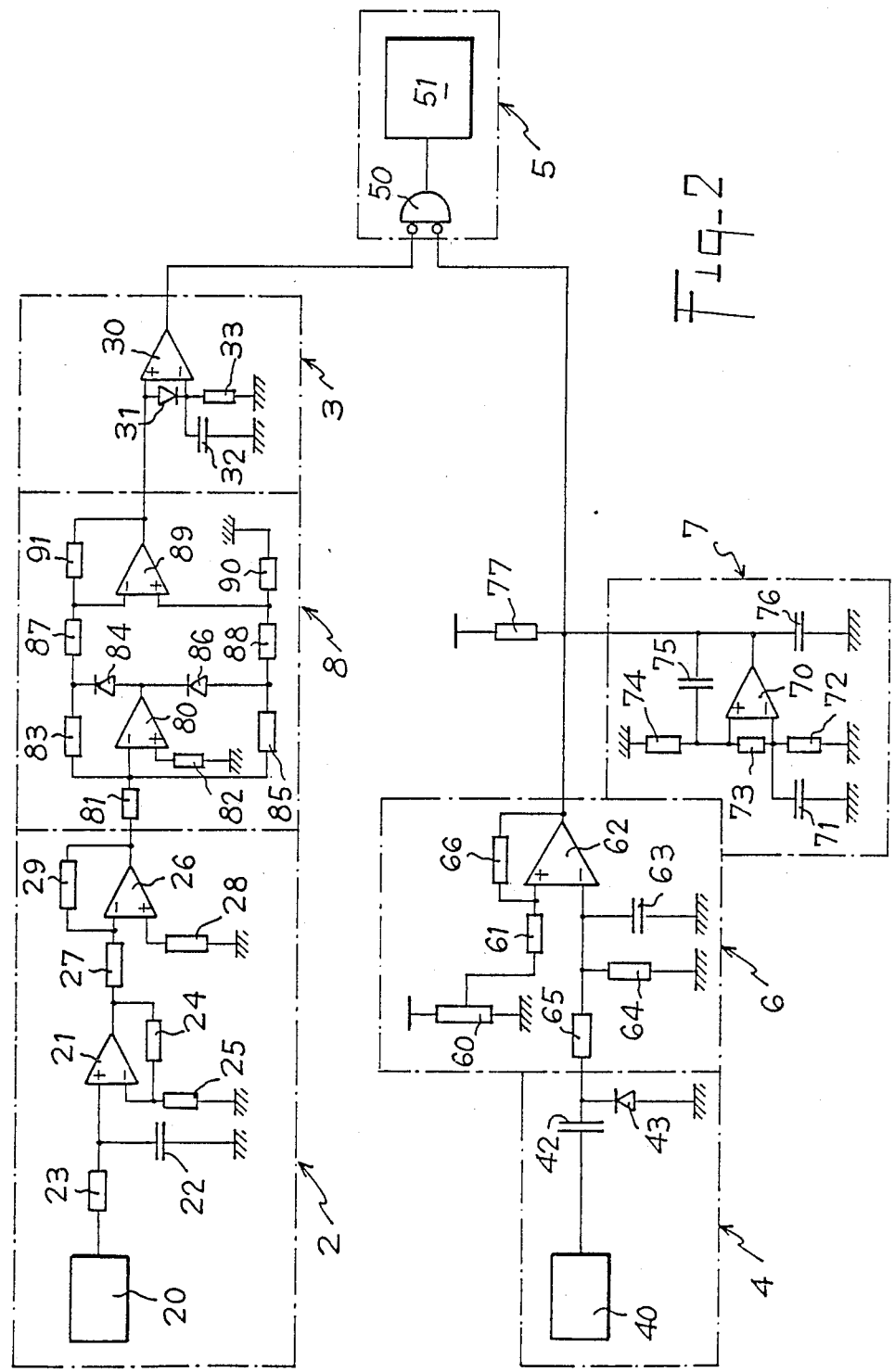
FIG. 2 illustrates an embodiment of a detection apparatus according to the invention.

FIG. 2 illustrates an embodiment of an apparatus 1 for detecting brief pulses due to electrostatic discharges from furniture or human beings. The apparatus 1 comprises a sensor 20, of any known type, such as a metallic conductor, designed to detect an electrostatic field. Sensor 20 is connected, in conventional manner, to an impedance matching stage constituted by an operational amplifier 21 of which the non-inverting input is connected, on the one hand, to earth by a capacitor 22 and, on the other hand, to the sensor 20 via a resistor 23. The inverting input of the amplifier 21 is connected to the output of the amplifier by a resistor 24 and to a resistor 25 connected to ground.

The impedance matching stage is followed by a stage of amplification of the detected signal, constituted by an operational amplifier 26 of which the inverting input is connected, by a resistor 27, to the output of the operational amplifier 21. The non-inverting input of the amplifier 26 is connected to ground by a resistor 28, whilst the inverting input is connected to the output of the operational amplifier 26 by a resistor 29.

The amplification stage is connected to the means 3 for detecting the variation of the electrostatic field, via a thresholdless full-wave rectifier 8 constituted by an operational amplifier 80, of which the inverting input is connected by a resistor 81 to the output of the amplifier 26 whilst the non-inverting input is connected to ground by a resistor 82. The inverting input of the operational amplifier 80 is connected to the output of the amplifier by a first branch comprising a resistor 83 mounted in series with a diode 84 of which the anode is connected to the output of the operational amplifier 80 and by a second branch comprising a resistor 85 mounted in series with a diode 86 of which the cathode is connected to the output of the operational amplifier 80. The cathode of diode 84 and the anode of diode 86 are respectively connected by resistors 87 and 88 to the inverting input and to the non-inverting input of an operational amplifier 89. The non-inverting input of the operational amplifier 89 is connected to ground by a resistor 90, whilst the inverting input is connected to the output of the operational amplifier by a resistor 91.

Detection means 3 is constituted by an operational amplifier 30 of which the non-inverting input is connected on the one hand, to the output of the operational amplifier 89 and, on the other hand, to the anode of a diode 31 of which the cathode is connected to the inverting input of the operational amplifier 30. The inverting input of the operational amplifier 30 is connected to a capacitor 32 and to a resistor 33, mounted in parallel and connected to ground. The detection means 3 is adapted to detect the first variation of the electrostatic field occurring in an interval of time of less than 1 millisecond.

Detector 4 is constituted by a sensor 40 of an electromagnetic field formed either, for example, by a metal loop to detect the magnetic component of the field or, for example, by an antenna to detect the electrical component of the field. Sensor 40 is connected to a detection stage constituted by a capacitor 42 connected to the sensor 40 and connected to the cathode of a diode 43 of which the anode is connected to earth.

It must be noted that sensor 40 may be distinct from sensor 20 or together perform the functions of detection of the electrostatic and electromagnetic fields. Sensor 40 may therefore be formed by an antenna constituted by a metallic wire, for example, of a length of the order of 30 cm.

Detector 4 is followed by the stage 6 for detecting the electromagnetic field beyond a threshold determined by a potentiometer 60 and corresponding to a value, for example, equal to 1 ampere per meter. The slide of the potentiometer is connected by a resistor 61 to the non-inverting input of an operational amplifier 62. The inverting input of the operational amplifier 62 is connected to a capacitor 63 connected to ground, to a resistor 64 connected to ground and a resistor 65 connected to the cathode of the diode 43. The non-inverting input of the operational amplifier 62 is connected, by a resistor 66, to the output of the operational amplifier 62 delivering a signal which is held by the circuit 7 so as to obtain a simultaneous activation of the means 5 by this signal and that delivered by the operational amplifier of the detection means 3.

It must be considered that the capacitors 42, 63 and the resistors 64, 65 take values adapted to constitute a high pass filter of which the cut-off frequency is included between 15 MHz and 200 MHz.

The circuit 7 for holding the signal, in the form of a monostable circuit, comprises an operational amplifier 70 of which the inverting input is connected to a capacitor 71 and a resistor 72, mounted in parallel and connected to ground. The non-inverting input of the operational amplifier 70 is connected to the inverting input by a resistor 73, to a positive voltage by a resistor 74 and to the output of the operational amplifier by a capacitor 75. The output of the operational amplifier 70 is connected by a capacitor 76 to ground by a resistor 77 to a positive voltage and to the output of the operational amplifier 62 which is connected to an input of an AND gate 50 of the warning means 5. The other input of the gate 50 is connected to the output of the amplifier 30. The warning means 5 also comprises a member 51 connected to the gate 50, making it possible to memorize the output signal issuing from the AND gate, so as to conserve the information in time. Such a member may be of any known type, such as for example a relay for energizing a warning lamp or a recorder.

The apparatus described hereinabove is intended to be placed in premises close to computer hardware in order to detect the electrostatic discharges from furniture or human beings, likely to occur in the environment thereof. Such an apparatus is adapted to detect such discharges likely to appear in the area extending up to ten meters therearound.

The sensor 20 detects the electrostatic field and delivers a signal of a value in relation to the level of the electrostatic field detected. Such a signal, which is amplified and rectified, is adapted to charge the capacitor 32. If the electrostatic field decreases sharply, due to an electrostatic discharge, the assembly constituted by the diode 31, the capacitor 32 and the resistor 33, generates a differential voltage with the result that there appears at the output of the operational amplifier 30, a signal indicating the presence of a variation of the electrostatic field. It is to be noted that the resistor 33 and the capacitor 32 present a determined time constant in order to produce a signal at the output of the operational amplifier 30 only if the variation of electrostatic field occurs in a time of less than 1 millisecond. In this way, the detection means 3 delivers a signal only when the variation of the electrostatic field is very rapid, corresponding, in particular, to an electrostatic discharge, from furniture or human beings, and not from simple fluctuations of the field. Considering a curve representing the electrostatic field as a function of time, the assembly constituted by the capacitor 32 and the resistor 33, allows detection when the curve presents a maximum slope.

The appearance of an electrostatic discharge is translated by a brief pulse generating an electromagnetic field which is detected by detector 4, if the electromagnetic field presents a frequency higher than 15 MHz. The signal, issuing from detector 4, is compared with the chosen threshold of the stage 6 in order to generate, in the event of exceeding the threshold, a signal which is applied to an input of the AND gate 50, during an interval of time of less than 1 millisecond. This signal is held by circuit 7 at the input of the AND gate 50 until the operational amplifier 30 delivers a signal, so as to obtain, simultaneously, a signal on the two inputs of the AND gate 50. It is necessary to hold the signal, due to the response time which is longer for the detection of the variation of the electrostatic field with respect to that of the electromagnetic field. In fact, it must be considered that an electrostatic discharge from furniture or human beings can be compared to a discharge of a capacitor of which the rise time is of the order of 1 nanosecond and the width at halfheight of the order of 30 nanoseconds.

The simultaneous presence of a signal on the two inputs of the AND gate 50 brings about the appearance of a signal at the output of the gate 50 which may be memorized or recorded by member 51 to indicate the presence and/or the moment of appearance of an electrostatic discharge.

Such an apparatus makes it possible to detect, in simple manner, the brief pulses due solely to electro static discharges from furniture or human beings. In fact, if a brief switching pulse or a pulse due to a storm occurs in the environment of the computer hardware, the AND gate 50 will no longer be activated on its input connected to the detector 4 of electromagnetic field and will not deliver a signal for energizing member 51. The variation of electrostatic field due to a storm will not be taken into account, by reason of the positioning of the apparatus within premises.

Locating the appearance of the electrostatic discharges from nearby furniture or human beings, makes it possible to choose technical solutions adapted to this type of phenomena. For example, it may be envisaged to treat the floors with anti-static products or to require the persons working near the computer hardware to wear a bracelet connected to ground.

The invention is not limited to the examples described and shown, as various modifications may be made thereto without departing from its scope.

What is claimed is:

1. A process for detecting pulses, of the type of which an electromagnetic field and an electrostatic field are detected, comprising the steps of:
   detecting the electromagnetic field and the electrostatic field within a predefined location;
   detecting the electromagnetic field using a high pass filter of which the cut-off frequency lies between approximately 15 MHz and 200 MHz inclusive;
   detecting a variation of the electrostatic field, said variation having a duration less than one millisecond; and
   producing a warning signal when the variation of the electrostatic field and the presence of the electromagnetic field are both detected within an interval of time less than one millisecond of each other.

2. The process as claimed in claim 1, wherein the warning signal is only produced if said electromagnetic field at least equals about one ampere per meter.

3. The process as claimed in claim 1, wherein the presence of the electromagnetic field is detected by detecting its electric field component.

4. The process as claimed in claim 1, wherein the presence of the electromagnetic field is detected by detecting its magnetic field component.

5. An apparatus for detecting pulses of the type of which an electromagnetic field and the electrostatic field are detected, comprising:
   a sensor for detecting an electrostatic field;
   a detector for detecting an electromagnetic field;
   a means for detecting a variation of the electrostatic field having a duration less than one millisecond; and
   a means responsive to both said electrostatic field sensor and said electromagnetic field sensor for producing a warning signal when the variation of the electrostatic field and the presence of the electromagnetic field are both detected within an interval of time less than one millisecond.

6. The apparatus as claimed in claim 5, further comprising means for detecting when the electromagnetic field at least equals about one ampere per meter and for providing an enabling signal to said warning signal producing means only when said electromagnetic field at least equals one ampere per meter.

7. The apparatus as claimed in claim 6, further comprising a circuit for receiving a signal issuing from said means for detecting when said electromagnetic field at least equals one ampere per meter, and for providing an enabling signal for said warning signal producing means for no longer than one millisecond after said electrostatic sensor detects said electrostatic field variation.

8. The apparatus as claimed in claim 5, wherein said warning signal producing means means further comprises means for recording the fact of issuance of said warning signal.

* * * * *